United States Patent [19]

Halder

[11] Patent Number: 4,496,932

[45] Date of Patent: Jan. 29, 1985

[54] CURRENT DIVIDER FOR CURRENT MEASUREMENT IN CONJUNCTION WITH A MEASUREMENT TRANSDUCER

[75] Inventor: Mathis Halder, Baar, Switzerland

[73] Assignee: Lgz Landis & Gyr Zug Ag, Zug, Switzerland

[21] Appl. No.: 600,521

[22] Filed: Apr. 16, 1984

[30] Foreign Application Priority Data

Apr. 25, 1983 [CH] Switzerland ............... 2197/83

[51] Int. Cl.$^3$ ............... H01F 40/06; G01R 15/02
[52] U.S. Cl. ............... 338/49; 324/127; 324/76 R; 324/117 R
[58] Field of Search ............... 338/49, 120, 333, 334, 338/328; 324/117 R, 126, 127, 76 R

[56] References Cited

U.S. PATENT DOCUMENTS

| | | | |
|---|---|---|---|
| 4,182,982 | 1/1980 | Wolf et al. | 324/127 |
| 4,240,059 | 12/1980 | Wolf | 338/49 |
| 4,309,655 | 1/1982 | Lienhard | 324/117 R |

FOREIGN PATENT DOCUMENTS

| | | |
|---|---|---|
| 3008308 | 3/1980 | Fed. Rep. of Germany. |
| 618043 | 4/1980 | Switzerland. |
| 1404719 | 9/1975 | United Kingdom. |
| 1464047 | 2/1977 | United Kingdom. |
| 2050070 | 12/1980 | United Kingdom. |

Primary Examiner—Clifford C. Shaw
Assistant Examiner—C. N. Sears
Attorney, Agent, or Firm—Ernest F. Marmorek

[57] ABSTRACT

A current divider for use in connection with a measurement transducer. The measurement transducer includes a magnetic core, is formed as a substantially flat and longitudinal conductor with two longitudinal slits so as to partition the flat conductor into at least a measurement conductor, and at least two shunts are connected in parallel with the measurement conductor. The shunts define a plane, and the measurement conductor is disposed in the plane between the shunts. The flat conductor has two openings along the longitudinal direction, to receive the magnetic core. One slit communicates with one opening, and the other slit communicates with the other opening.

10 Claims, 4 Drawing Figures

CURRENT DIVIDER FOR CURRENT MEASUREMENT IN CONJUNCTION WITH A MEASUREMENT TRANSDUCER

BACKGROUND OF THE INVENTION

Known current dividers, for example according to German Pat. DE No. 30 08 308, subdivide the current to be measured according to the ratio of the electrical conductivities of respective parallel conductors into various partial currents, and wherein the portion of the current flowing in the measurement conductor generates a flux in the magnetic core of a measurement transducer, while currents flowing in the shunts do not contribute to the flux in the magnetic core. Compared to other current dividers, which are, for example, based on the difference principle (German Pat. DE No. 30 40 544), or on the principle of the Wheatstone bridge (U.S. Pat. No. 4,240,059, German No. OL 24 57 797), the first-mentioned known current dividers have a current dividing ratio which is much less dependent on the electrical resistivity of the various current paths. Current dividers are also taught by Lienhard et al in U.S. Pat. No. 4,309,655, in the corresponding German Pat. No. 27 34 729, as well as in the corresponding Swiss Pat. No. 618,043. But in these patents the measurement conductor and the shunts are either not in the same plane, or the shunts do not contribute to the flux in the magnetic core, which construction does not yield the highest degree of stability of the dividing ratio in the face of varying current magnitudes. A current or voltage transformer, where the current division is determined by the geometry of the circuit element carrying the secondary current with respect to the element carrying the primary current is taught in Swiss Pat. No. 537,085; this construction does not yield a high degree of stability of the current dividing ratio with varying current magnitudes either. In spite of the advantage of the principle described in the introductory part of this section, the very high demands which are frequently made on the stability of the current dividing ratio could not so far be met with simple means.

SUMMARY OF THE INVENTION

It is therefore one of the objects of the present invention to devise a simple current divider of the aforedescribed type, which consists of a single flat conductor, and which has a particularly high degree of measurement accuracy.

This object is attained by providing a current divider in connection with use for a measurement transducer, and wherein the measurement transducer includes a magnetic core formed as a substantially flat and longitudinal conductor, which has at least two longitudinal slits, so as to partition the flat conductor into at least a measurement conductor, and at least two shunts connected in parallel with the measurement conductor. The shunts define a plane, and the measurement conductor is disposed in the plane between the shunts. The flat conductor has two openings along its longitudinal direction and the openings are adapted to receive the magnetic core, one slit communicating with one opening, the other slit communicating with the other opening.

Other objects will either become apparent on perusing the description of the preferred embodiments, or will be ascertainable from the claims.

BRIEF DESCRIPTION OF THE DRAWINGS

For a fuller understanding of the nature and objects of the invention, reference should be had to the following detailed description, taken in connection with the accompanying drawings in which.

DESCRIPTION OF THE PREFERRED EMBODIMENTS

Figure 1:
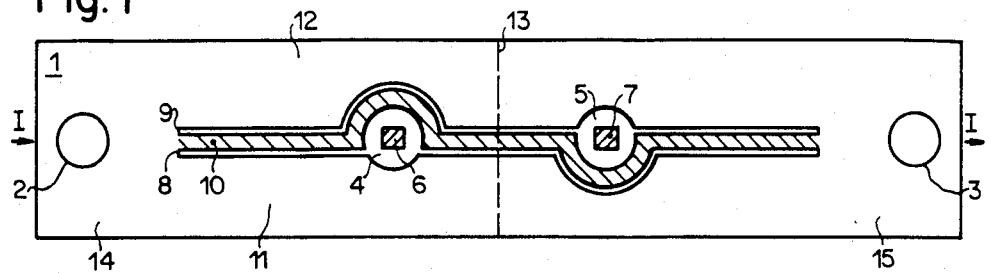
FIG. 1 is a top plan view of the current divider, according to the present invention.

Referring now to the drawings, there is shown in FIG. 1 a flat conductor 1 which consists of a single sheet-metal strip or of a metal block of constant thickness, and which is provided with connectors 2 and 3 on its respective longitudinal ends. The current I to be measured flows by means of the connector 2 through the flat conductor 1, and leaves the flat conductor 1 through the connector 3. The flat conductor is formed with two successive openings 4 and 5 along its longitudinal direction. A first leg 6 of a closed magnetic core of a measurement transducer not further illustrated in FIG. 1 passes through the opening 4, and a second leg 7 of the magnetic core passes through the opening 5. The flat conductor 1 is further formed with two slits 8 and 9 substantially extending along its longitudinal direction, and preferably along approximately the entire length of the flat conductor 1. These slits partition the flat conductor 1 into a measurement conductor 10 bordered by the slits 8 and 9, respectively, as well as into to shunts 11 and 12 connected electrically, as well as into to shunts 11 and 12 connected electrically in parallel with the measurement conductor 10. For clarity's sake the measurement conductor 10 has been shown shaded in the drawing. The slit 8, which is disposed on the right side, as considered in the direction of the flow of current, communicates with the opening 4, and the slit 9, which is disposed on the left side, again as considered in the direction of the flow of current, communicates with the opening 5. Each slit 8 and 9 has substantially the shape of a semicircle in the vicinity of the opening 5 or 4, respectively, and has a width corresponding approximately to the distance separating the silts 8 and 9 during their straight-path course, namely outside of the region of the openings 4 and 5. Again, as viewed in the direction of the current flow, the measurement conductor 10 passes in a semi-circular manner around the opening 4, passes towards the opening 5, passes thorugh the magnetic core 6, 7, and finally passes again in a semi-circular manner on the right side around the opening 5. The shunts 11 and 12, however, pass on the right and left sides of the magnetic core 6, 7, respectively. Consequently the portion of the current passing through the measurement conductor 10 is responsible for generating the primary flux in the magnetic core 6 and 7. Current division is determined by the electrical impedances of the measurement conductor 10, and of the shunts 11 and 12, respectively, and is therefore substantially determined by the ratio of the width of the measurement conductor 10 to that of the flat conductor 1, as, on one hand, the slits 8 and 9 are very narrow, and as, on the other hand, the openings 4 and 5 are relatively small.

Contrary to known embodiments, the measurement conductor 10 does not leave the plane of the flat conductor 1. Rather the measurement conductor 10 is disposed in the same plane as the shunts 11 and 12, is embedded between the shunts 11 and 12, and is separated from the shunts 11 and 12 substantially along its entire length only by the slits 8 and 9, so that an intimate thermal contact is ensured between the measurement conductor 10 and the shunts 11 and 12. One lateral wall of the measurement conductor 10 is only spaced from the corresponding shunt 11 or 12 within the region of the respective opening 4 or 5, while its other lateral wall is also spaced within the region of the openings 4 and 5 from the respective adjoining shunt 12 and 11, so that almost an ideal temperature equalization, and consequently a current distribution in the flat conductor 1 independent of the magnitude of the current I to be measured is ensured, and a high degree of measurement accuracy is thereby obtained.

Advantageously the width of the slits 8 and 9 is small in comparison to the thickness of the measurement conductor 1, so that an optimal heat coupling between the measurement conductor 10 and the shunts 11 and 12 is obtained. The length of the measurement conductor 10 is advantageously large in comparison to the width of the openings 4 and 5, as a result of which that region of the measurement conductor 10, in which the isothermal conditions are not completely fulfilled, is negligibly small.

Operating methods free of any filings, or capable of removing filings, are suitable for generating the slits 8 and 9. Particularly narrow slits can be generated by means of a laser beam. An electrically insulating and thermally conducting layer can be introduced into the slits 8 and 9.

The flat conductor 1 is preferably U-shaped. This can be accomplished if the flat conductor 1 is bent along a bending or reversing edge 13 in a direction transverse to its longitudinal direction, namely by 180°. This results in both openings 4 and 5 being superimposed, so that legs 14 and 15 of the flat conductor 1, which are separated from one another by only a thin insulating layer, are in intimate thermal contact with one another. In this manner optimal thermal conditions are realized, if the width of the slits 8 and 9 is small compared to the spacing distance between the legs 14 and 15.

Figure 2:
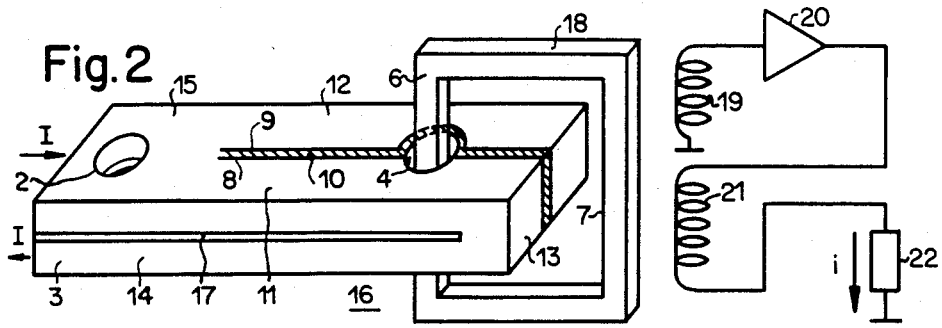
FIG. 2 is a perspective view of the current divider shown in plan view in FIG. 1.

The shape of a U-shaped flat conductor can also be obtained from a casting, or by means of an extruded part. FIG. 2 shows an example of a flat conductor 16, manufactured in this manner, in which the same parts, or parts having the same function, have been allocated identical reference numerals. For the sake of clarity the slits 8 and 9 are depicted in FIG. 2 as simple straight lines. A sheet of aluminum anodized on both sides is advantageously employed as the insulating layer 17 between the legs 14 and 15. The leg 6 of the magnetic core 18 passes through both the opening 4, as well as through the opening 5, (the latter not being illustrated in FIG. 2), while the leg 7 of the magnetic core closes the magnetic circuit external to the flat conductor 1.

In the example illustrated the measurement transducer which has been described operates as a so-called active measurement transducer. For this purpose a detector winding 19 disposed on the magnetic core 18 is connected to the input of an amplifier 20, whose output is in turn connected to a series circuit consisting of a secondary winding 21 and of a load 22.

The flat conductor 16 represents the primary winding of the measurement transducer. The part of the current flowing in the measurement conductor 10 is responsible fro the primary flux. Compensation of the primary flux is accomplished in a known manner by a current i flowing in the secondary winding 21, which is controlled in a (non-illustrated) regulating circuit in such a manner by the amplifier 20, that the voltage generated in the detector winding 19 tends towards zero.

As a result of the current distribution in the flat conductor 16 being independent of the magnitude of the current I to be measured, a very high measurement accuracy is obtained. As both shunts 11 and 12, as well as the measurement conductor 10 extend in both the direction of the current flow, as well as in a direction opposite thereto along the legs 14 and 15, an arrangement which is largely free of any induction results, and a very small stray field is generated, which in turn leads at most to only a small phase error.

The detector winding 19 can be dispensed with, if in lieu thereof there is used a magnetic field sensor, which, for example, senses the magnetic field in the air gap of the magnetic core 18, and which is connected to the input of the amplifier 20.

The transducer which has been described can also be a time-multiplexed transducer as taught by Lienhard et al in U.S. Pat. No. 4,309,655. In that case parts 19 through 22 are dispensed with, and an alternating reference flux is superimposed onto the primary flux of the magnetic core 18 by means of a premagnetisation winding, and the zero crossings of the resultant magnetic field are sensed by means of a magnetic field sensor disposed in the airgap of the magnetic core 18.

The U-shaped flat conductor 1 or 16 can be used easily in a measurement transducer having a magnetic core formed with three legs. If the flat conductor is used as a primary winding in a pot-shaped magnetic core, then, if necessary, matching of the shape to the external contours of the flat conductor 16 may be required.

Figure 3:
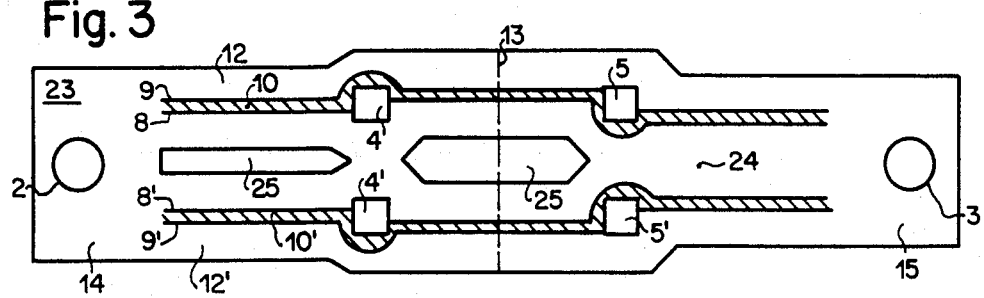
FIG. 3 is a top plan view of a second embodiment of the current divider.

The flat conductor 23, according to FIG. 3 has two additional openings 4' and 5', as well as two additional slits 8' and 9' in addition to the openings 4 and 5, and the two slits 8 and 9, respectively. The openings 4 and 4', the openings 5 and 5', the slits 8 and 8', as well as the slits 9 and 9' are disposed in a mirror-symmetrical manner arund the longitudinal axis of the flat conductor 23. The slits 8 and 9, and 8' and 9', respectively, partition the flat conductor 23 into two outer shunts 12 and 12', as well as into a center shunt 24, and into two measurement conductors 10 and 10', and wherein the measurement conductor 10 is disposed between the shunts 12 and 24, and the measurement conductor 10' is disposed between the shunts 12' and 24'. Following folding of the flat conductor 23 about the reversing edge 13, the opening 5 is superimposed with the opening 4, while the opening 5' is superimposed with the opening 4'. The openings 4 and 5 serve to receive the leg 6 of the magnetic core 18 (FIG. 2), while the openings 4' and 5' serve to receive the leg 7. The sum of the current portions flowing in the two measurement conductors 10 and 10' is responsible for generating the primary flux in the magnetic core 18.

It will be easily appreciated that the flat conductor 23 causes the same advantageous effects as the flat conductors 1 or 16. As both legs 6 and 7 of the magnetic core 18 pass through the flat conductor 23, there results a largely symmetrical arrangement, and consequently a high degree of insensitivity with respect to any influences of an external interfering field.

The center shunt 24 of the flat conductor 23 is formed with means, for example recesses 25, which are so shaped that the cross-sectional area of the shunt 24 is approximately constant over its entire length, so that a constant current density, and consequently a uniform heating is obtained. Alternate means accomplishing the same purpose is to vary the width of the flat conductor 23 along its length so as to achieve that constant current density.

Figure 4:
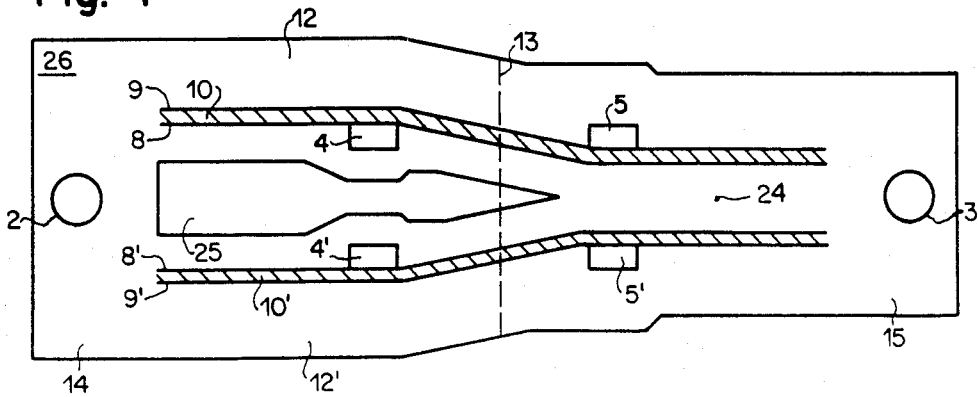
FIG. 4 is a top plan view of a third embodiment of the current divider.

In the flat conductor 26 according to FIG. 4, the slits 8 and 9, and 8' and 9' are so formed, that the measurement conductors 10 and 10' consist of three cnsecutive linear portions, respectively, and wherein the half-portions of the measurement conductors 10 and 10' belonging to the leg 14 are disposed further outwardly than the half-portions belonging to the leg 15. Following folding of the flat conductor 26, this leads to an optimal superposition of the individual conductive parts, namely the parts of the shunts 12, 12' and 24 belonging to one leg 14 or 15, respectively, are superimposed with corresponding parts belonging to the other leg 15 or 14, of the measurement transducers 10 and 10', respectively.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A current divider, for use in connection with a measurement transducer, and wherein the measurement transducer includes a magnetic core,
   comprising in combination
   a substantially flat and longitudinal current conductor having at least two longitudinal slits, thereby partitioning the flat conductor into at least a measurement conductor and at least two shunts connected in parallel with the measurement conductor, said shunts defining a plane,
   said measurement conductor being disposed in said plane and between said shunts,
   said flat conductor having two openings along the longitudinal direction, said openings being adapted to receive said magnetic core, one slit communicating with one opening, the other slit communicating with the other opening.

2. The current divider as claimed in claim 1, wherein the current conductor is U-shaped so as to form two legs, and one opening is superimposed onto the other opening, said legs being electrically insulated from one another, and being in intimate thermal contact with one another.

3. The current divider as claimed in claim 1, wherein said flat conductor has a predetermined width, and wherein the width of said slits is small compared to said predetermined width of said flat conductor.

4. The current divider as claimed in claim 2, wherein said legs are spaced from one another by a predetermined distance, the width of said slits being small compared to said predetermined distance.

5. The current divider as claimed in claim 1, wherein each opening has a prearranged width, the length of said measurement conductor being large compared said prearranged width.

6. The current divider as claimed in claim 2, wherein said flat conductor has two additional longitudinal slits, said slits thereby partitioning said flat conductor into two outer shunts and a center shunt, as well as into two measurement conductors, each measurement conductor being disposed between one outer shunt and said center shunt.

7. The current divider as claimed in claim 1, further comprising means for maintaining the current density in said shunts constant.

8. The current divider as claimed in claim 7, wherein said means for maintaining the current density in said shunts constant comprises recesses formed in said flat conductor.

9. The current divider as claimed in claim 7, wherein said means for maintaining the current density in said shunts constant comprises shaping said flat conductor so that it has a width varying to such an extent along its length so as to maintain the current density in said shunts constant.

10. The current divider as claimed in claim 6, wherein some portions of the shunts are associated with one leg, and the remaining portions of the shunts are associated with the other leg, said some portions of said shunts being substantially super-imposed with the remaining portions of said shunts.

* * * * *